United States Patent [19]

Fullowan et al.

[11] Patent Number: 5,168,071
[45] Date of Patent: Dec. 1, 1992

[54] METHOD OF MAKING SEMICONDUCTOR DEVICES

[75] Inventors: Thomas R. Fullowan, North Plainfield; Stephen J. Pearton, Summit; Fan Ren, Warren, all of N.J.

[73] Assignee: AT&T Bell Laboratories, Murray Hill, N.J.

[21] Appl. No.: 680,953

[22] Filed: Apr. 5, 1991

[51] Int. Cl.$^5$ .............................................. H01L 29/70
[52] U.S. Cl. ....................................... 437/31; 437/184; 156/656
[58] Field of Search .................. 437/31, 184; 156/656; 148/100

[56] References Cited

U.S. PATENT DOCUMENTS

| | | | |
|---|---|---|---|
| 4,541,893 | 9/1985 | Knight | 156/656 |
| 4,650,543 | 3/1987 | Kishita et al. | 156/656 |
| 4,871,419 | 10/1989 | Nakano | 156/656 |
| 4,889,831 | 12/1989 | Ishii et al. | 437/184 |
| 4,917,759 | 4/1990 | Fisher et al. | 156/656 |
| 4,931,136 | 6/1990 | Pausch et al. | 156/656 |
| 5,007,984 | 4/1991 | Tsutsumi et al. | 156/656 |

OTHER PUBLICATIONS

"Physics and High Speed Devices", by A. F. J. Levi et al, *Proceedings of the 2nd International Conference on InP and Related Materials*, Denver, Colo., Apr. 1990, pp. 6–12.

*Primary Examiner*—Olik Chaudhuri
*Assistant Examiner*—Long Pham
*Attorney, Agent, or Firm*—E. E. Pacher

[57] ABSTRACT

Disclosed is a method of making semiconductor devices that comprises etching of a semiconductor layer, with a patterned metal layer acting as the etch mask. The patterned metal layer comprises a mask metal layer (exemplarily Ti) overlying a contact metal layer (exemplarily a Au-containing layer). In an exemplary embodiment the inventive method is used to manufacture InP-based heterojunction bipolar transistors.

11 Claims, 5 Drawing Sheets

METHOD OF MAKING SEMICONDUCTOR DEVICES

The government has rights in this invention pursuant to Contract No. F33615-89-C-1098 awarded by the Department of the Air Force.

FIELD OF THE INVENTION

This invention pertains to methods of making semiconductor devices. More specifically, it pertains to methods of making devices that comprise at least one indium-containing heteroepitaxial semiconductor layer.

BACKGROUND OF THE INVENTION

It has been recognized that indium-containing (typically InP-based) semiconductor devices such as heterojunction bipolar transistors (HBTs) can have significant advantages over the corresponding more conventional GaAs-based devices. For instance, among the advantages of InP-based HBTs over GaAs-based HBTs are potentially higher speed, lower turn-on voltage (and thus lower power requirements), scalability, and higher substrate thermal conductivity. Furthermore, InP-based HBTs could be more readily integrated with InP-based lasers and other opto-electronic components that operate in the commercially important 1.3–1.55 μm wavelength regime. For a review of InP-based HBTs see, for instance, A. F. J. Levi et al., *Proceedings of the 2nd International Conference on InP and Related Materials*, Denver, Colo., April 1990, pp. 6–12.

While great strides have been made in the understanding of the physics of indium-containing semiconductor devices and in methods of epitaxial growth of the multilayer structures required for these devices, processing methods used up to now to produce InP-based HBTs are not well adapted for industrial implementation. Thus, it would be highly desirable to have available a method of making indium-containing HBTs (and other indium-containing semiconductor devices) that is compatible with the requirements of device integration, lends itself to commercial implementation through, inter alia, avoidance of critical alignment steps, and makes possible realization of the advantageous device characteristics that are potentially available. This application discloses such a method.

DEFINITIONS AND GLOSSARY

A "contact metal layer" herein is a layer of any of the metals useful for contacting semiconductor devices, exemplarily Au-containing metals such as AuBe and AuGe, W-containing metals such as tungsten silicide.

A "mask metal layer" herein is a metal layer that substantially resists etching in a given dry-etching medium.

By "substantially resists etching" we mean herein that the etch rate of a given material in a given dry-etching medium is so low that at least some of the given material remains at completion of the relevant etching step. By way of illustration, a given metal layer that overlies a portion of a semiconductor layer that is to be etched "substantially resists etching" in the given dry-etching medium if, at completion of the etching step, the thickness of the metal layers has not been reduced to zero.

"Patterning of a layer" is any operation that results in removal of predetermined portions of the layer, with the remainder of the layer remaining. Removal of exposed regions of a layer by etching is a known patterning technique. Another known patterning technique, frequently referred to as "lift-off", involves deposition of material uniformly over a surface with a patterned processing layer (e.g., a patterned resist layer) thereon, and removing by appropriate means the processing layer with the deposited material thereon.

"Indium-containing" semiconductor devices herein are semiconductor devices (including opto-electronic as well as electronic devices) that comprise at least one heteroepitaxial semiconductor layer that comprises In as a major constituent.

SUMMARY OF THE INVENTION

In a broad aspect the invention is a method of making a semiconductor device that comprises etching of a semiconductor layer, with a patterned metal layer acting as the etch mask. The patterned metal layer comprises a mask metal layer disposed on a contact metal layer.

In a particular embodiment the inventive method comprises providing a semiconductor body comprising a semiconductor substrate with one or more indium-containing heteroepitaxial layers thereon. The method further comprises depositing a contact metal layer onto at least a portion of the semiconductor body, patterning the contact metal layer, and carrying out one or more further steps (exemplarily including one or more of photolithography, etching, metalization, encapsulation and packaging) towards completion of the device. Significantly, the method also comprises depositing a mask metal layer onto the unpatterned contact metal layer, patterning the two metal layers in a single patterning step, and exposing the semiconductor body with the patterned metal layers thereon to an appropriate dry-etching medium such that at least a portion of at least one of the heteroepitaxial layers is removed.

Although practice of the method is not limited to making In-containing semiconductor devices, the currently preferred embodiment of the invention is a method of making such devices, exemplarily In-based HBTs. The preferred embodiment can of course be readily applied to making other In-containing devices, including opto-electronic devices such as lasers. Among possible mask metals are Ti and Al, with Ti being preferred.

DETAILED DESCRIPTION OF A PREFERRED EMBODIMENT

An exemplary embodiment of the inventive method was used in the manufacture of InP-based HBTs that exhibited good scaling, high gain and high cutoff frequency. The embodiment will now be described in some detail.

Figure 1:
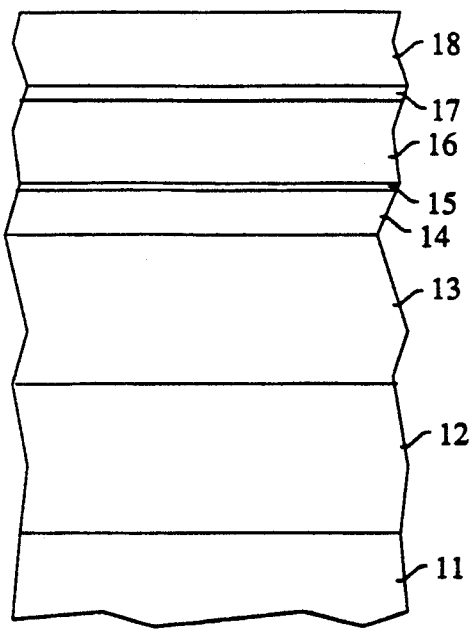
FIGS. 1–12 schematically depict an exemplary HBT at various stages of manufacture according to the invention.

On a semi-insulating InP substrate was grown a multilayer heteroepitaxial structure that is schematically depicted in FIG. 1. In that Figure, numeral 11 refers to the InP substrate, 12 designates a 400 nm $n^+(1.5\times10^{19}$ cm$^{-3}$) InGaAs subcollector layer, 13 a 400 nm $n^-(6\times10^{16}$ cm$^{-3})$ InGaAs collector layer, 14 a 150 nm $p^+(1\times10^{19}$ cm$^{-3})$ InGaAs base layer, 15 a 10 nm not intentionally doped InGaAs spacer layer, 16 a 200 nm $n(7.5\times10^{17}$ cm$^{-3})$ AlInAs emitter layer, 17 a 50 nm $n^+$ ($1.5 \times 10^{19}$ cm$^{-3}$) AlInAs emitter cap layer, and 18 a 200 nm $n^+$($3 \times 10^{19}$ cm$^{-3}$) InGaAs emitter cap layer. Growth was in commercially available apparatus by MBE at 500° C. The ternary layers were lattice matched, with compositions Al$_{0.48}$In$_{0.52}$As and In$_{0.53}$Ga$_{0.47}$As, respectively. Elemental sources of Si and Be were used for n- and p-type doping, respectively.

Figure 2:
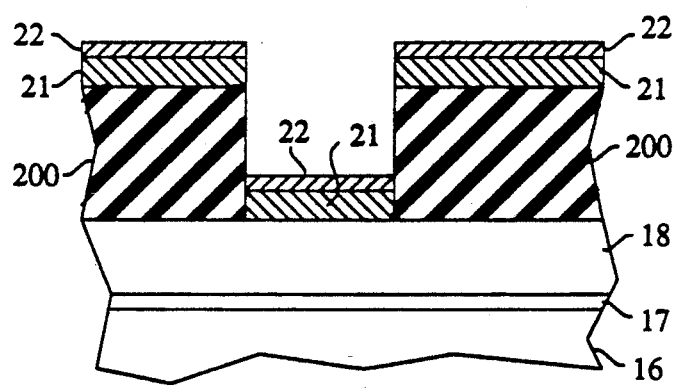
Figure 3:
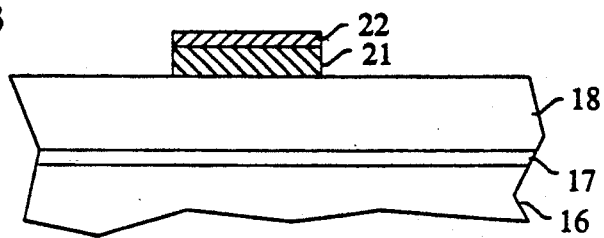

The thus prepared semiconductor body was exposed to Ar$^+$ ions to remove surface oxide and assure good metal adhesion. The ion acceleration voltage advantageously is kept low (e.g., 100 V) to prevent damage to the cap layer. Subsequently a conventional processing layer (200 of FIG. 2) was formed on the cap layer, and the processing layer patterned by a conventional technique to expose semiconductor regions (exemplarily including $2 \times 4$ $\mu$m$^2$ regions) that are to become emitter contacts. A 300 nm layer of AuGe was evaporated onto the thus prepared surface, followed by e-beam deposition of 50 nm of Ti. The resulting structure is schematically shown in FIG. 2, wherein numerals 21 and 22 refer to the AuGe (contact metal) layer and Ti (mask metal) layer, respectively. The processing layer (200) with layers 21 and 22 thereon was then removed by a conventional lift-off technique, resulting in a structure as depicted in FIG. 3, in which the remaining portions of layers 21 and 22 constitute masks for the next etching step.

The etching step involved dry etching of the exposed regions of InGaAs layer 18, and was carried out in a PLASMA THERM SL772 electron cyclotron resonance (ECR) system using a CH$_4$/H$_2$/Ar discharge. Although other dry etching techniques (e.g., reactive ion etch) can be used, ECR etching is considered to be advantageous since relatively low bias voltages can be used in this technique. Low bias voltage is expected to minimize damage to exposed semiconductor surfaces. Furthermore, although other etching media (e.g., containing CCl$_2$F$_2$) may be used in some circumstances, CH$_4$/H$_2$/Ar is an advantageous medium since it can give straight side walls, with substantially no undercut, and smooth surfaces.

Figure 4:
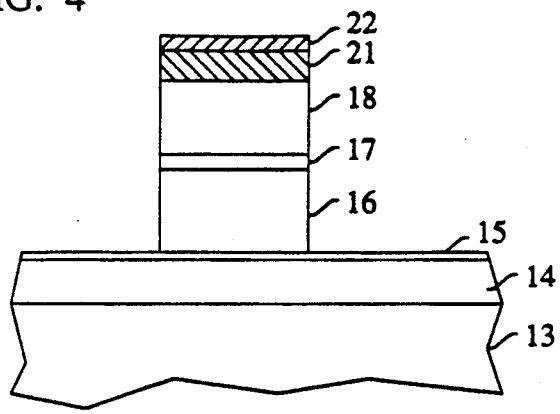

Exemplarily, the etch conditions were as follows: operating pressure 1 mTorr, gas flow rate 30 sccm, gas mixture 5CH$_4$/17H$_2$/8Ar, microwave power 130 W, substrate bias 100 V until 80% of the InGaAs layer thickness was removed, 75 V thereafter. These conditions resulted in an etch rate of about 5 nm/min for InGaAs, and essentially zero for AlInAs and Ti. After removal of 100% of the thickness of layer 18 the DC bias was increased to 150 V while maintaining constant all other process parameters. Under these conditions, AlInAs was etched at a rate of about 3 nm/min. Since InGaAs is also etched under these conditions (at about 8 nm/min) it is important to closely monitor this step. This can be done by, for instance, stylus profilometry, although a non-contacting method such as spectrometry will be preferable in a manufacturing environment. Upon completion of the semiconductor etching, the polymer deposit on the masked areas was removed in a 50 sccm ECR O$_2$ plasma with 25 V bias on the sample and a microwave power level of 300 W. FIG. 4 schematically depicts the resulting structure.

Figure 5:
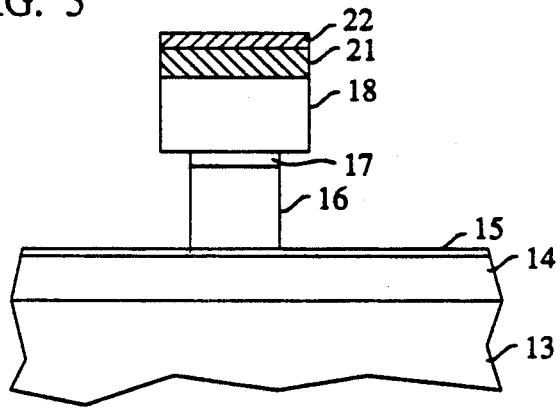

By means of a selective chemical etch (containing K$_2$Cr$_2$O$_7$, H$_2$O and H$_3$PO$_4$) a slight undercut of AlInAs (16, 17) under InGaAs layer 18 was produced, as shown schematically in FIG. 5. This was done to ensure that the (later deposited) base contact is spaced from emitter 16. To avoid a loss in feature size it will typically be desirable to keep the undercut to a minimum. Exemplarily, an undercut $\leq 0.2$ $\mu$m was found satisfactory in many cases.

Figure 6:
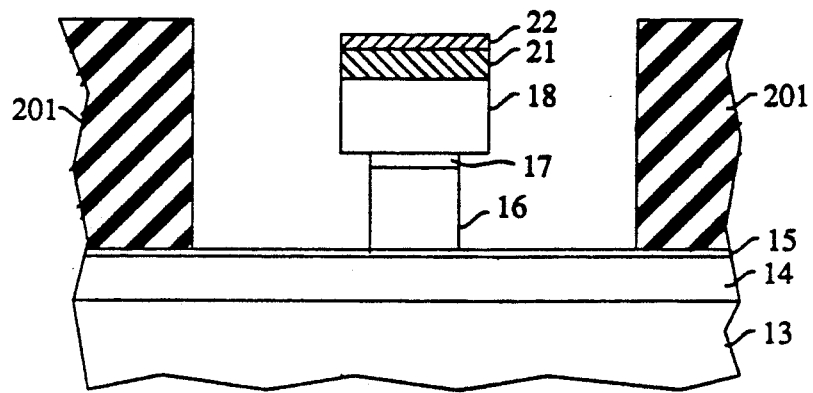
Figure 7:
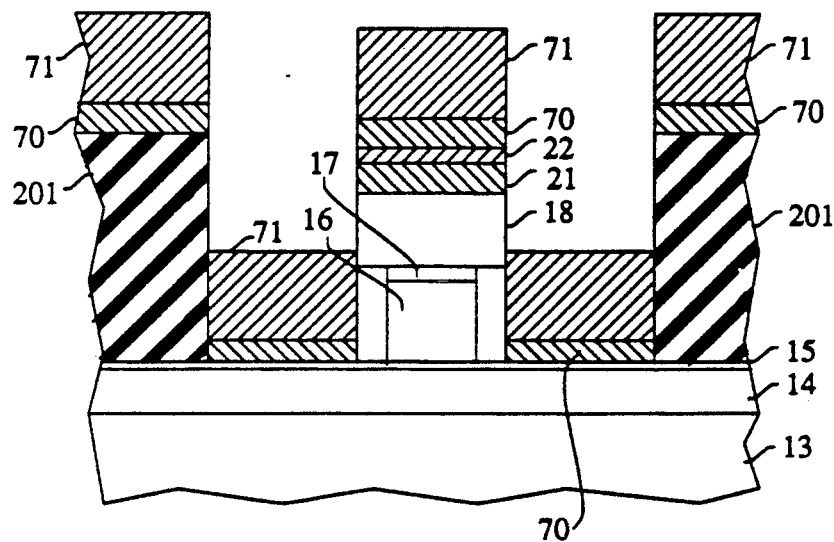

Next, a conventional processing layer (201 of FIG. 6) was deposited, and windows opened therein by conventional photolithography, as shown schematically in FIG. 6. Onto the thus prepared wafer surface was deposited by e-beam evaporation a 120 nm layer (70) of AuBe (contact metal), followed by deposition of a 200 nm layer 171 of Ti (mask metal), as shown schematically in FIG. 7.

Figure 8:
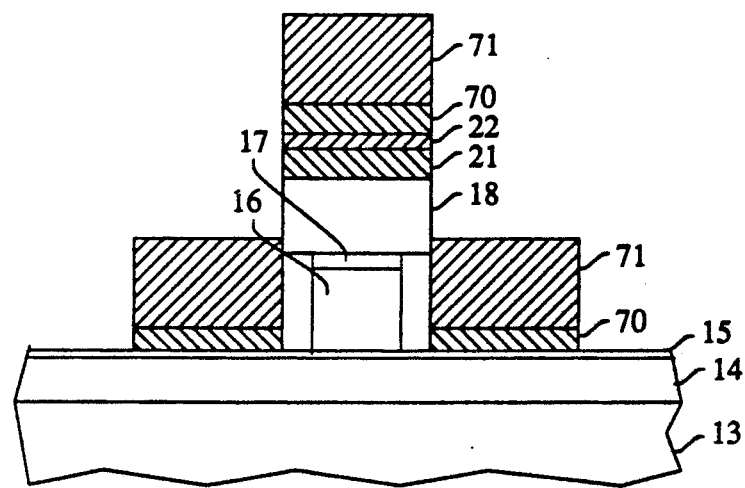
Figure 9:
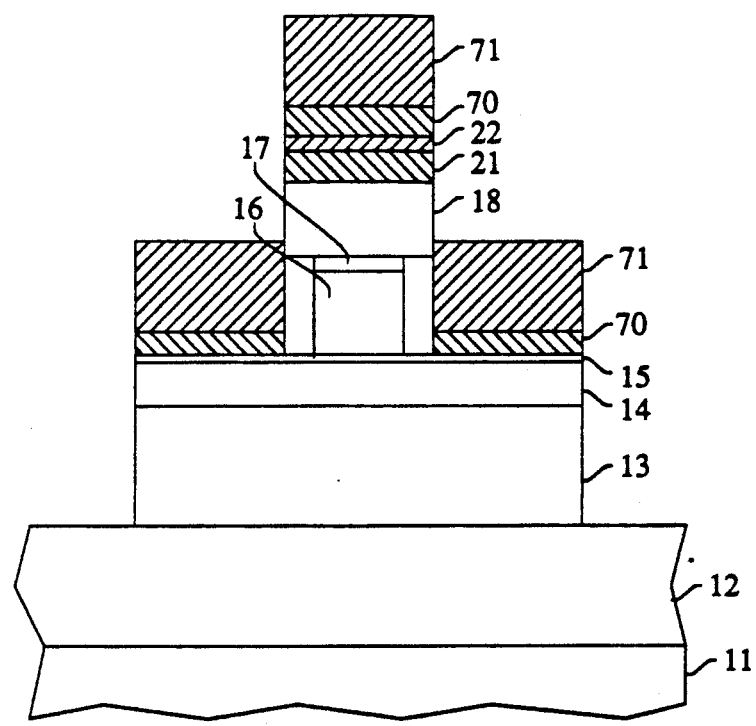

After removal (by conventional means) of processing layer 201 (see FIG. 8), the base mesa was formed by ECR etching under conditions substantially like those described above. The resulting structure is depicted schematically in FIG. 9. As those skilled in the art will recognize, the portions of 70 and 71 that are disposed on spacer layer 15 serve as self-aligned masks. Furthermore, mask metal layer 71 serves to protect the emitter-base junction from damage during plasma etching.

Figure 10:
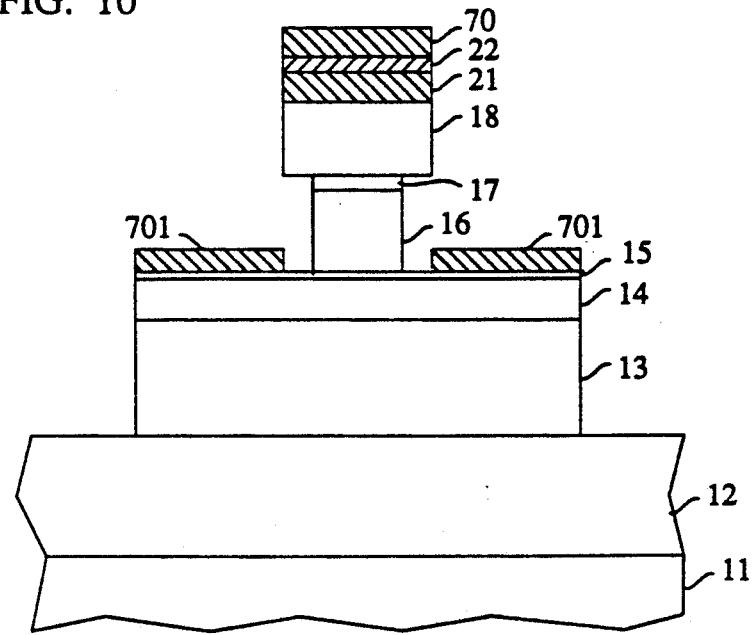

Subsequently, mask metal layer 71 was removed by conventional means (dilute HF), resulting in a structure as depicted schematically in FIG. 10, wherein numerals 701 designate the base contact.

Figure 11:
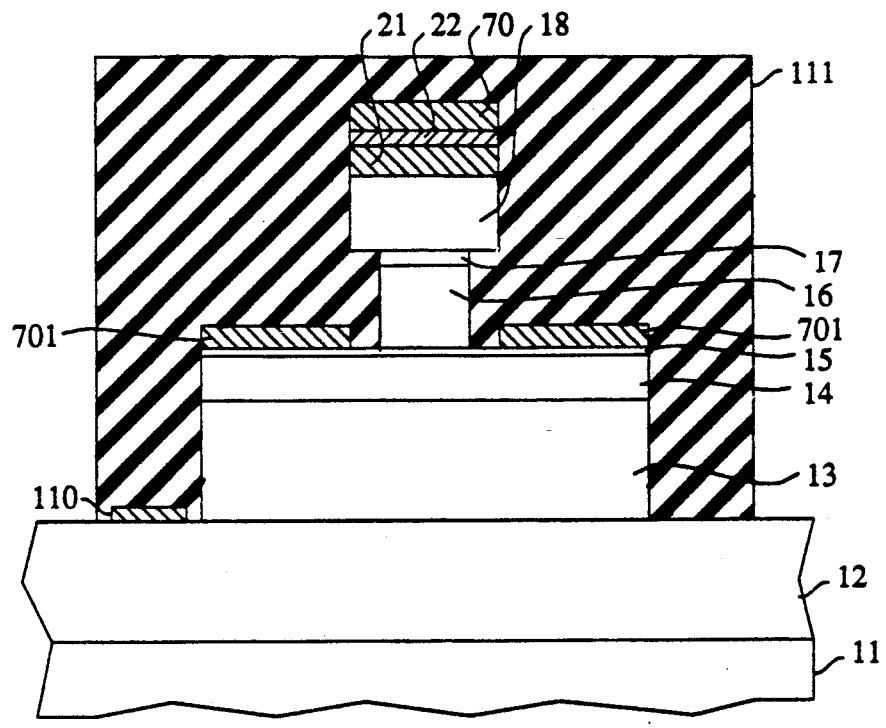
Figure 12:
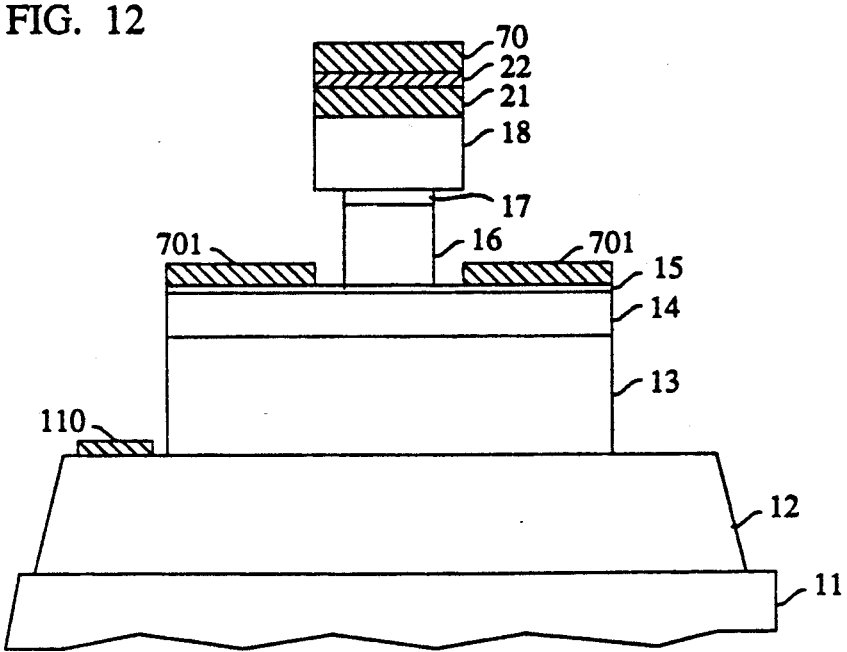

A AuGe collector contact (110) was deposited (using lift-off) onto sub-collector 12 after a short dip in a citric acid, hydrogen peroxide and water etch, followed by formation of a conventionally patterned processing layer (111) that covers the thus produced structure as shown schematically in FIG. 11. This is followed by etching in the above-mentioned etch to produce the collector mesa and thereby to achieve device-to-device isolation. Subsequently the patterned processing layer 111 was removed. The resulting structure is schematically depicted in FIG. 12.

This was followed by deposition over the whole wafer of a layer of silicon nitride. Exemplarily, this was done by Plasma Enhanced Chemical Vapor Deposition (PE-CVD) in a known manner. Via holes were etched through the nitride layer (using a known CF$_4$ Reactive Ion Etch Process) to the respective emitter, base and collector contacts, and TiPtAu final metal deposited to connect to the contacts through the via-holes.

Devices manufactured substantially as described were tested by conventional techniques. They typically exhibited current gains in excess of 70, independent of emitter size (the smallest emitter size was $2 \times 4$ $\mu$m$^2$, although the inventive technique could readily produce devices with smaller emitters). Uniform turn-on voltages were also observed regardless of emitter size. An exemplary device ($2 \times 4$ $\mu$m$^2$ emitter size) had a frequency of unity short-circuit current gain (f$_T$) of 57 GHz, and a frequency of unity maximum-available-power gain (f$_{max}$) of 35 GHz.

It will be appreciated that the above description is exemplary only, and that the inventive method can be adapted to make a range of devices, including other than InP-based devices.

We claim:

1. Method of making a semiconductor device comprising a) providing a semiconductor body comprising a substrate with one or more indium-containing heteroepitaxial layers thereon;

b) depositing a contact metal layer onto at least a portion of said semiconductor body;

c) patterning said contact metal layer; and d) carrying out one or more further steps towards completion of the device;

characterized in that the method further comprises e) depositing a mask metal layer onto the contact metal, the mask metal differing from the contact metal and selected from the group of metals that substantially resist etching in a given dry-etching medium;

f) patterning, in a single patterning step, said mask metal layer and the underlying contact metal layer; and g) exposing the semiconductor body with said patterned metal layers thereon to the given dry-etching medium such that at least a portion of at least one indium-containing heteroepitaxial layer is removed.

2. Method of claim 1, wherein the substrate is a InP substrate, the mask metal layer comprises Ti, the contact metal layer comprises Au, and the semiconductor device is a heterojunction bipolar transistor comprising an emitter region, a base region, and a collector region, and further comprising means for electrically contacting the emitter, base, and collector regions, respectively, with at least one of said means comprising said contact metal.

3. Method of claim 2, wherein the dry etching medium comprises methane.

4. Method of claim 3, wherein step g) is carried out in electron cyclotron resonance plasma etching means.

5. Method of claim 1, further comprising removing, subsequent to step g), said mask metal from the contact metal.

6. Method of claim 2, wherein the transistor is electrically connected to at least one other semiconductor device on said semiconductor body.

7. Method of making a heterojunction bipolar transistor comprising a) providing a semiconductor body comprising a InP substrate with a multiplicity of In-containing heteroepitaxial layers thereon;

b) depositing Au-containing contact metal and Ti-containing mask metal onto at least a portion of the semiconductor body, with the mask metal disposed on the contact metal;

c) patterning, in a single patterning step, the contact metal and the mask metal such that a portion of the semiconductor body is exposed;

d) contacting at least the exposed portion of the semiconductor body with a $CH_4$-containing etching medium and applying microwave energy to the etching medium such that semiconductor material is removed from the portion of the semiconductor body; and e) carrying out one or more further steps towards completion of the transistor.

8. Method of claim 7 wherein, prior to step b), a patterned processing layer is formed on a major surface of the semiconductor body such that a predetermined region of the major surface is not covered by the processing layer material, and such that a region that includes said portion of the semiconductor body is covered by the processing layer material; step b) comprises depositing the contact metal and the mask metal onto the patterned processing layer and the predetermined region of the major surface; and step c) comprises removing the patterned processing layer.

9. Method of claim 7, wherein the multiplicity of In-containing heteroepitaxial layers comprises a third layer overlying a second layer, the second layer contactingly overlying a first layer, with the method comprising i) removing, prior to step b), a part of the third and second layers such that a predetermined region of the first layer is exposed, and forming a patterned processing layer such that a first portion of the predetermined region of the first layer remains exposed and a second portion of said region is covered by processing layer material;

ii) step b) comprises depositing the contact metal and the mask metal onto at least the first portion of said region of the first layer;

iii) step c) comprises removing the patterned processing layer such that the second portion of said region is exposed; and iv) step d) comprising removing at least some of the first layer material in the second portion of said region.

10. Method of claim 9, wherein the combined thickness of the contact metal and the mask metal overlying said first portion of the predetermined region of the first layer exceeds the distance between the first layer and the third layer.

11. Method of claim 9, wherein step i) comprises forming a first patterned processing layer on the third layer such that a predetermined region of the third layer is not covered by first processing layer material, depositing the or a contact metal and the or a mask metal onto the patterned first processing layer and the predetermined region of the third layer, and removing the patterned first processing layer.

* * * * *